United States Patent
Qiu et al.

(10) Patent No.: US 11,661,648 B2
(45) Date of Patent: May 30, 2023

(54) HIGH-PERFORMANCE WAFER-LEVEL LEAD SULFIDE NEAR INFRARED PHOTOSENSITIVE THIN FILM AND PREPARATION METHOD THEREOF

(71) Applicant: Dalian University of Technology, Liaoning (CN)

(72) Inventors: Jijun Qiu, Liaoning (CN); Yingmin Luo, Liaoning (CN); Jiming Bian, Liaoning (CN); Zhennan Yu, Liaoning (CN)

(73) Assignee: HANGZHOU MIL-CHIP ELECTRONIC TECH. CO., LTD., Hangzhou (CN)

(*) Notice: Subject to any disclaimer, the term of this patent is extended or adjusted under 35 U.S.C. 154(b) by 0 days.

(21) Appl. No.: 17/345,539

(22) Filed: Jun. 11, 2021

(65) Prior Publication Data

US 2021/0388480 A1 Dec. 16, 2021

(30) Foreign Application Priority Data

Jun. 12, 2020 (CN) .......................... 202010532605.0

(51) Int. Cl.
| | |
|---|---|
| *C23C 14/06* | (2006.01) |
| *C23C 14/02* | (2006.01) |
| *C23C 14/26* | (2006.01) |
| *C23C 14/35* | (2006.01) |
| *C23C 14/58* | (2006.01) |
| *H01L 31/032* | (2006.01) |
| *H01L 31/18* | (2006.01) |

(52) U.S. Cl.
CPC ........ *C23C 14/0623* (2013.01); *C23C 14/021* (2013.01); *C23C 14/26* (2013.01); *C23C 14/35* (2013.01); *C23C 14/5853* (2013.01); *H01L 31/0324* (2013.01); *H01L 31/18* (2013.01)

(58) Field of Classification Search
None
See application file for complete search history.

(56) References Cited

U.S. PATENT DOCUMENTS

| | | | | |
|---|---|---|---|---|
| 3,026,218 A | * | 3/1962 | Morgan | C23C 14/0623 338/18 |
| 6,509,066 B1 | * | 1/2003 | Jost | C23C 14/0623 427/255.35 |
| 2009/0154908 A1 | * | 6/2009 | Engle | C23C 16/4485 219/440 |

FOREIGN PATENT DOCUMENTS

CN 102417204 A * 4/2012

OTHER PUBLICATIONS

Machine Translation of CN-102417204-A.*

* cited by examiner

*Primary Examiner* — David P Turocy

(57) ABSTRACT

Provided are a method for preparing a high-performance wafer-level lead sulfide near infrared photosensitive thin film. Firstly, a surface of the selected substrate material is cleaned; next, a vaporized oxidant is introduced into a vacuum evaporation chamber under a high background vacuum degree, and a PbS thin film is deposited on the clean substrate surface to obtain a microstructure with medium particle, loose structure and consistent orientation. Finally, under a given temperature and pressure, a high-performance wafer-level PbS photosensitive thin film is obtained by sensitizing the film prepared at step S2 using iodine vapor carried by a carrier gas. This preparation method is simple, low-cost and repeatable. The PbS photosensitive thin film has a high photoelectric detection rate. The 600K blackbody room temperature peak detection rate is $>8 \times 10^{10}$ Jones. The corresponding non-uniformity in a wafer-level photosensitive surface is <5%, satisfying the requirements of preparation of a PbS Mega-pixel-level array imaging system.

6 Claims, 5 Drawing Sheets

HIGH-PERFORMANCE WAFER-LEVEL LEAD SULFIDE NEAR INFRARED PHOTOSENSITIVE THIN FILM AND PREPARATION METHOD THEREOF

TECHNICAL FIELD

The present invention belongs to the field of photoelectronic devices, and relates to a photosensitive thin film of an infrared photoconductive detector and a preparation method thereof. Specifically, the present invention relates to a lead sulfide (PbS) photosensitive thin film sensitive to near infrared (1-3 µm) radiation prepared by vacuum physical low-temperature oxidation deposition technique. The high performance herein refers to a room temperature peak detection rate (D*) is not lower than $8 \times 10^{10}$ Jones.

BACKGROUND

Infrared focal plane detector, as a core component for detecting, identifying and analyzing infrared information of an article, is capable of converting an invisible infrared image into a visual image. The un-cooled infrared detector can work at room temperature without a cooling device, and features small volume, light weight, low consumption, long service life, low costs and quick start and the like. Therefore, the un-cooled infrared detector is widely applied to many fields such as industrial detection, process control, urban monitoring, fire fighting security, traffic management and unmanned vehicle driving.

Lead sulfide (PbS) has been proved usable in developing an un-cooled near infrared (1-3 µm) photon detector and has wide application prospects. In 2001, American Litton Electro-Optical Systems Company successfully prepared a mixed PbS near infrared photoconductive focal plane imaging system with a pixel scale of 320×240, and a cell size of 30 µm by using dry chemical preparation method, which starts a prelude to large-scale research and development of un-cooled photon imaging systems (T. Beystrum, N. Jacksen, M. Sutton, et al., Low cost 320×240 Lead Salt Focal Plane Array, Proc. SPIE: Infrared Imaging Systems: Design, Analysis, Modeling, and Testing XII, 2001, 4372, 96-104). As a standard process of preparing a lead salt thin film, chemical bath deposition (CBD) preparation PbS technique is relatively mature, and can obtain a high-sensitivity PbS near infrared detector under the assistance of a mild low and medium temperature oxidation processing technique (called sensitization process), so as to meet the strict requirements of the military field for device performances. However, the PbS photosensitive thin film prepared by wet chemical preparation has the disadvantages of complex process, coarse film surface, poor uniformity, high manufacturing costs, low repeatable operability, and difficulty in large-area preparation and the like, which greatly limits the development of the PbS array imaging system of Mega-pixel level and becomes an insurmountable obstacle in the wet chemical preparation technique (T. H. Johnson, Lead Salt Detectors And Arrays PbS And PbSe, Proc. SPIE 0443: Infrared Detectors, 1983, 60-94; Si Junjie, A Method of Preparing a Photosensitive Lead Salt Thin Film of an Infrared Detector, CN200610156551.2, Nov. 4, 2009; Sun Weiguo, Hu Rongwu, A Laser Sensitization Method of a Lead Sulfide Polycrystalline Thin Film, CN87102141, May 15, 1991; Chen Song, Ya Hong, Meng Jin et al. A Lead Sulfide Infrared Detector Capable of Realizing Self-Calibration, CN201620725303.4, Mar. 27, 2018; Shan Qi, Shi Zhi, Xiao Zhu, A Lead Sulfide Infrared Detector, CN94218772.5, Jan. 10, 1996; Deng Hong, Chen Jinju, Wei Min, Li Guowei, A Method of Preparing a Preferred Orientation Lead Sulfide Thin Film, CN101792930B, Dec. 21, 2011; Shi Lei, Sun Xigui, Shen Xiangcheng et al. A Method of Preparing a Lead Sulfide Thin Film by Chemical Liquid Phase Method, CN109559977A, effective for substantive examination at Mar. 1, 2019). Compared with CBD method, the physical process can easily prepare a large-area photosensitive thin film with smooth surface and high uniformity, which is an ideal alternative to break through the technical barrier of the chemical bath deposition technique.

However, the existing PbS detectors manufactured by a physical process such as thermal evaporation, magnetron sputtering, molecular beam epitaxy, chemical vapor deposition for preparing the PbS thin film are low in sensitivity (one order of magnitude lower than CBD process device) and lack reproducibility, which becomes the largest technical barrier for industrialization application of the physical preparation process (J. V. Morgan, U.S. Pat. No. 3,026,218, 1962). Therefore, the development of a physical preparation technique of a high-performance wafer-level PbS photosensitive thin film is the key to push forward the development of a near infrared un-cooled imaging system of Mega-pixel level.

SUMMARY

The object of the present invention is to provide a physical preparation method for a high-performance wafer-level PbS photosensitive thin film. The method of the present invention is simple in operation, and high in repeatability, has excellent infrared photosensitive property and can achieve uniform performance up to wafer size.

In order to achieve the above object, the present invention adopts the following technical scheme.

Provided is a method for preparing a high-performance wafer-level lead sulfide near infrared photosensitive thin film, which includes the following steps.

At step S1, an appropriate wafer-level substrate material is selected, and a surface of the selected substrate material is cleaned to improve the adhesion of a PbS thin film to a wafer-level substrate.

At step S2, a vaporized oxidant is introduced into a vacuum evaporation chamber under a high background vacuum degree, and a PbS thin film is slowly deposited on the clean substrate surface in step S1 to obtain a microstructure with medium particle, loose structure and consistent orientation.

At step S3, under a given temperature and pressure, a high-performance wafer-level PbS photosensitive thin film is obtained by performing sensitization for the PbS thin film prepared at step S2 by using iodine vapor carried by a carrier gas.

In the above technical scheme, the wafer-level substrate in step S1 should have good insulation property, and can still have good chemical stability, mechanical performance and electrical performance after being treated at high temperature (>450° C.). The substrate includes but not limited to one of: high-resistivity silicon (Si), Sapphire ($Al_2O_3$), fused quartz glass ($SiO_2$), common glass (Glass), zinc sulfide (ZnS), zinc selenide (ZnSe), and calcium fluoride ($CaF_2$).

In the above technical scheme, the surface treatment of the wafer-level substrate at step S1 may be performed by wet chemical cleaning or high temperature thermal cleaning or the like. Preferably, the wet chemical cleaning treatment is adopted. The process includes the following steps:

A: placing in acetone, ethanol and de-ionized water in sequence for ultrasonic cleaning;

B: employing one or more of acid wash, alkali wash and plasma cleaning;

C: cleaning the washed substrate using de-ionized water and drying to obtain the wafer-level substrate with clean surface.

In the above technical scheme, the oxidant introduced into the vacuum chamber at step S2 includes but not limited to halogen gas, ozone, hydrogen peroxide and the like. Preferably, the halogen gas is adopted. The process includes the following steps:

A: the background vacuum degree of the vacuum chamber being not smaller than $2\times10^{-4}$ Pa;

B: controlling a flow rate to 10-25 sccm;

C: maintaining the vacuum degree of the vacuum chamber at $2\text{-}5\times10^{-2}$ Pa after introduction of oxidant.

In the above technical scheme, the preparation of the PbS thin film in the vacuum chamber at step S2 may be performed by deposition technique such as resistive thermal evaporation, electron beam thermal evaporation or magnetron sputtering or the like. Preferably, the resistive thermal evaporation deposition technique is adopted. The process includes the following steps:

A: a purity of a PbS evaporation source being not smaller than 99.99%;

B: controlling a PbS deposition temperature to 50-120 degrees Celsius;

C: controlling a PbS deposition rate to 0.4-1.2 micron/hour;

D: controlling a PbS thickness to 1.2-1.5 microns.

In the above technical scheme, the carrier gas in step S3 may include not limited to air, high purity oxygen (not lower than 99.99%) and inert gas. Preferably, the oxygen is adopted. The iodine vapor sensitization process includes the following steps:

A: a flow rate of the carrier gas being 1-10 SCCM;

B: controlling a flow rate of the iodine vapor to 0.01-1 sccm;

C: controlling a sensitization pressure to 1.001-1.005 standard atmospheric pressures;

D: controlling a sensitization temperature to 250-400 degrees Celsius; stopping supplying iodine vapor after the temperature drops to 250° C.; stopping supplying the carrier gas after the temperature drops to room temperature;

E: controlling a sensitization time to 5-240 min.

The high-performance wafer-level lead sulfide near infrared photosensitive thin film is prepared by the above preparation method.

The present invention has the following beneficial effects.

1) The preparation method of the present invention is simple in operation, low in costs. The process control is easy to operate with high repeatability. Thus, the wafer-level PbS photosensitive thin film can be prepared, facilitating large-scale commercial production.

(2) The PbS photosensitive thin film prepared in the present invention has a high photoelectric detection rate. The 600K blackbody room temperature peak detection rate is $>8\times10^{10}$ Jones.

(3) The PbS photosensitive thin film prepared in the present invention has smooth surface. The corresponding non-uniformity in a wafer-level photosensitive surface is smaller than 5%, thus satisfying the requirements of preparation of a PbS Mega-pixel-level array imaging system.

BRIEF DESCRIPTIONS OF THE DRAWINGS

DETAILED DESCRIPTIONS OF EMBODIMENTS

The present invention will be further detailed in combination with specific embodiments and accompanying drawings, but the present invention is not limited to these embodiments of the present invention.

Embodiment 1

At step S1, a common glass of 3 inches was placed in acetone, ethanol and de-ionized water in sequence for respective ultrasonic cleaning for 10 min, and then placed in a concentrated sulfuric acid for 2 h of impregnation. Next, the glass substrate was washed repeatedly using flowing de-ionized water, and then ultrasonically cleaned for 10 min in de-ionized water and then dried to obtain a glass wafer substrate with clean surface.

At step S2, the clean glass wafer substrate was conveyed into a PbS evaporation reaction chamber and heated to 50° C. after a vacuum degree reached $5\times10^{-4}$ Pa, and then a PbS source temperature was gradually increased to an eruption temperature. Next, chlorine gas was introduced at a flow rate of 10 sccm and the vacuum degree of the reaction chamber was maintained at $2\times10^{-2}$ Pa by adjusting a pumping force of a vacuum system. After vacuum stabilization, a growth baffle plate was opened to start to carry out PbS thin film deposition. After two hours, the baffle plate was closed, a PbS source and a substrate heating power source were stopped, and the chlorine gas input was also stopped. The thin film had a thickness of 1.2 microns. The PbS deposition rate was 0.6 microns/hour.

Figure 1:
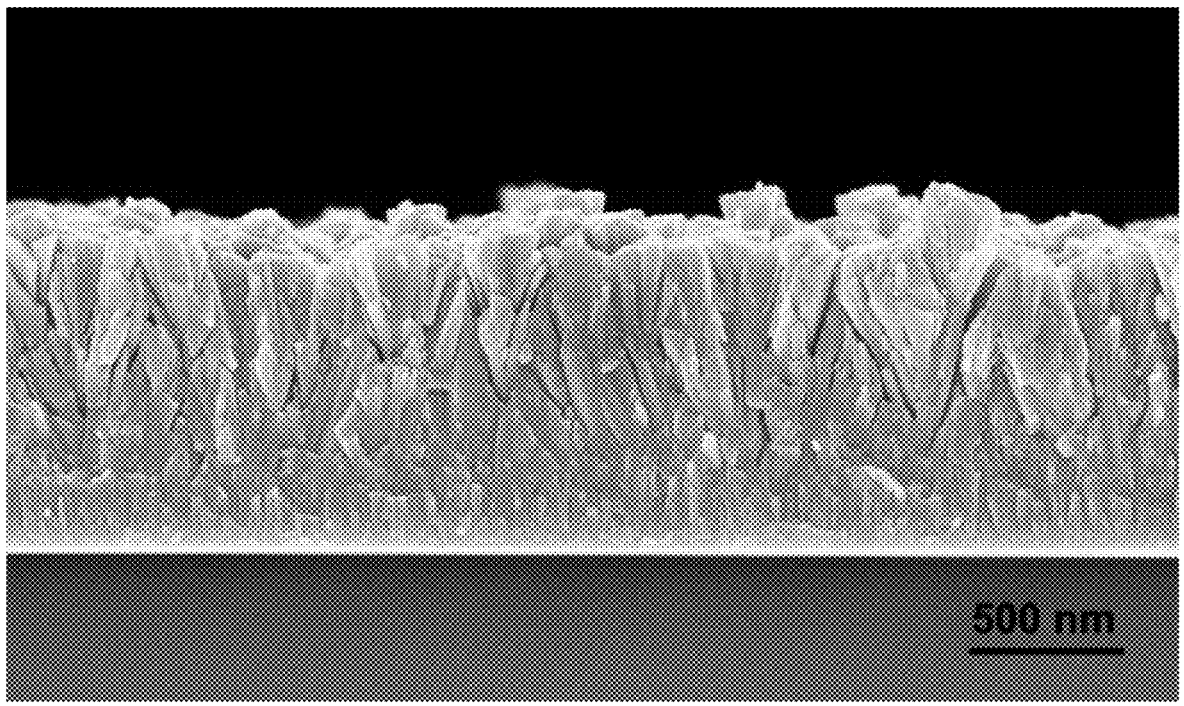
FIG. 1 is a SEM image of a section of a typical PbS photosensitive thin film.
Figure 2:
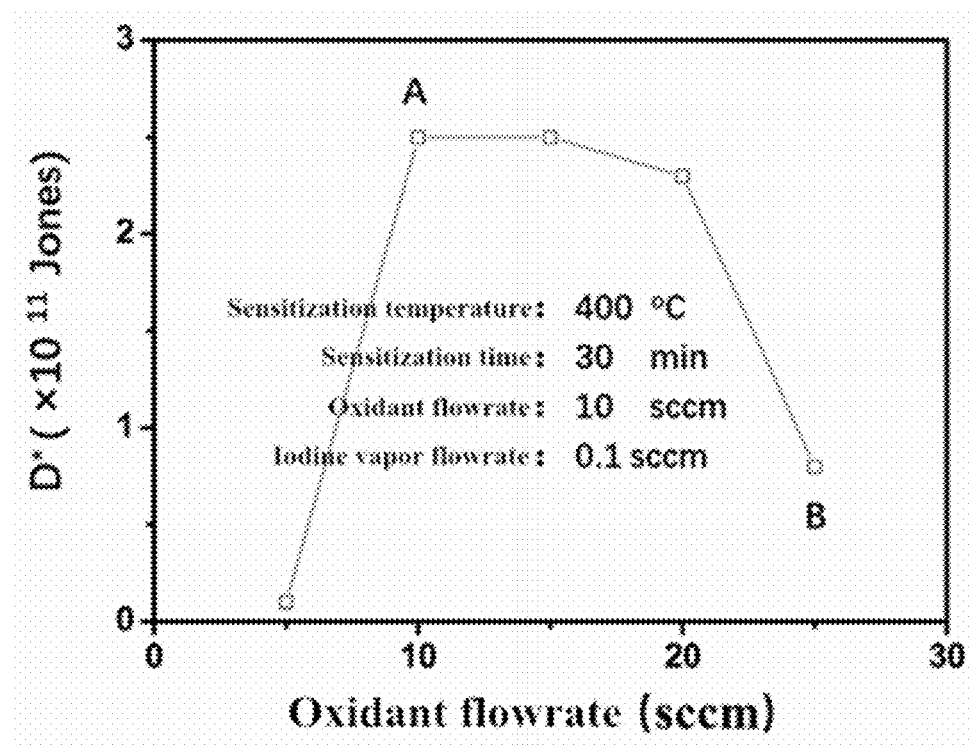
FIG. 2 shows an influence of an oxidant flow rate on a detection rate of a PbS photosensitive thin film.
Figure 3:
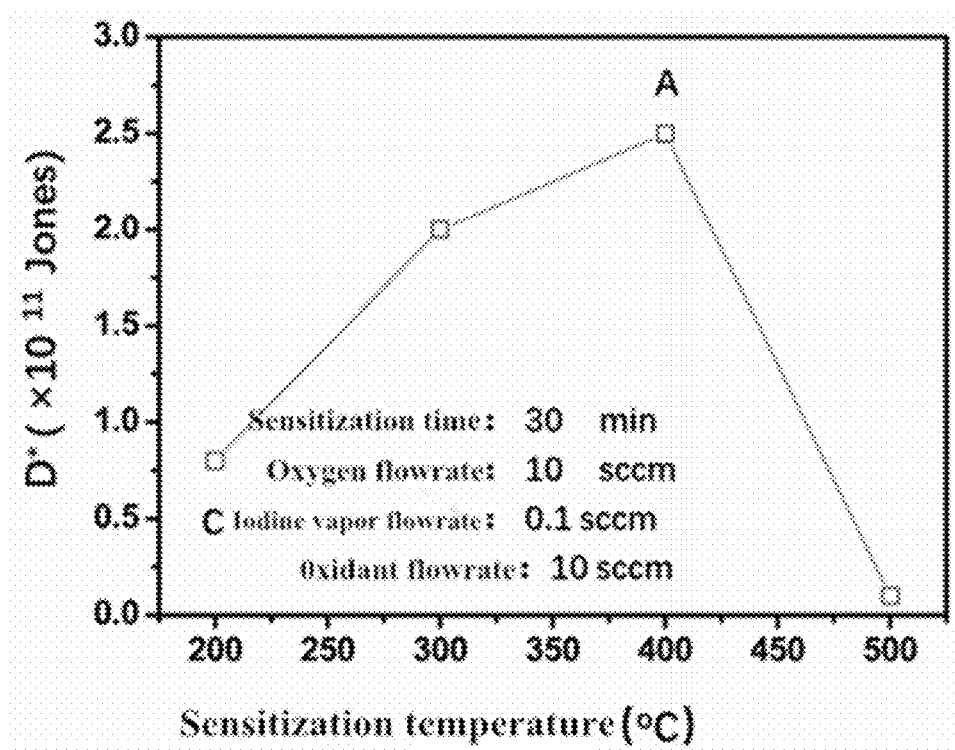
FIG. 3 shows an influence of a sensitization temperature on a detection rate of a PbS photosensitive thin film in a sensitization process.
Figure 4:
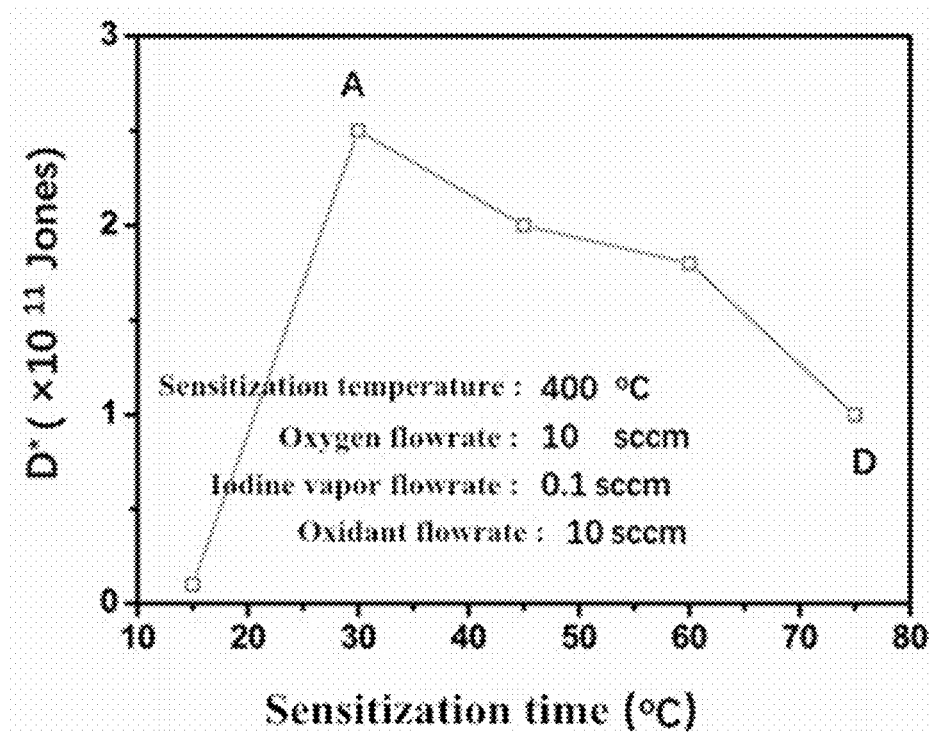
FIG. 4 shows an influence of a sensitization time on a detection rate of a PbS photosensitive thin film in a sensitization process.
Figure 5:
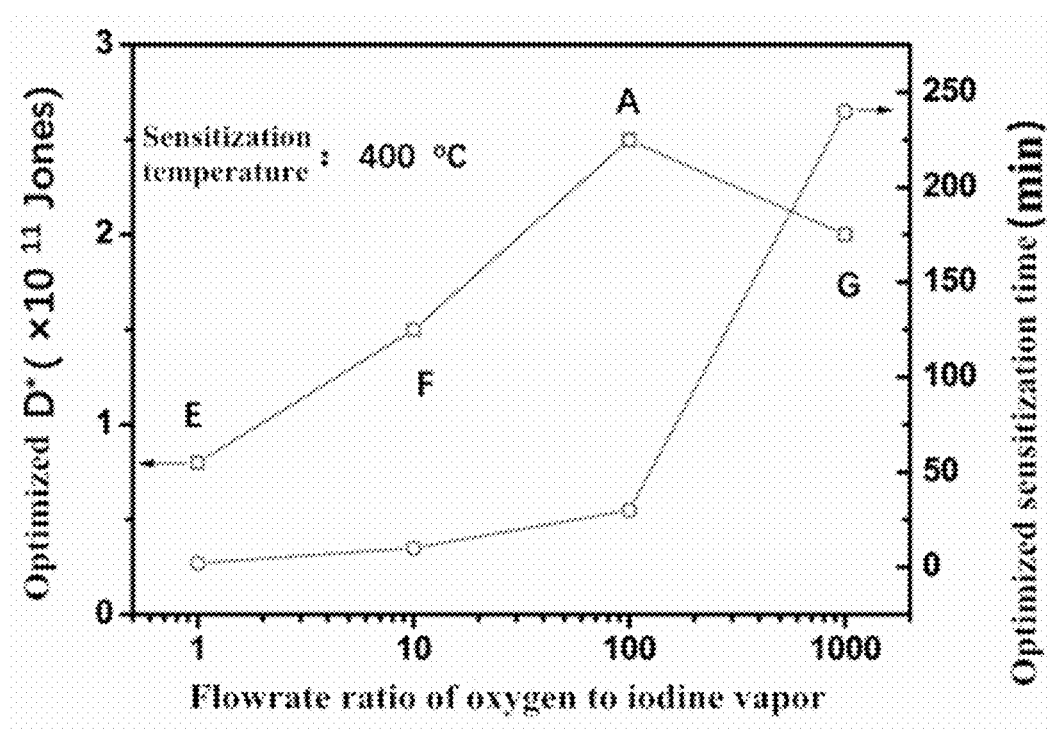
FIG. 5 shows an influence of an oxygen/iodine gas flow rate on a detection rate of a PbS photosensitive thin film in a sensitization process.

At step S3, the glass wafer PbS thin film was placed into a sensitization furnace, and oxygen was introduced at a flow rate of 10 sccm to enable a pressure inside the furnace to stay at 1.001 atmospheric pressures. Next, the sensitization furnace was heated to 400° C., and then iodine vapor of 0.1 sccm was introduced for 30 min. Afterwards, the temperature started to drop. After the temperature was decreased to 250° C., the supply of iodine vapor was stopped. After the temperature was decreased to room temperature, the supply of oxygen was stopped. At this time, 600k blackbody room temperature peak detection rate was $2.5\times10^{11}$ Jones as shown by the point A in FIGS. 2, 3, 4, and 5.

Embodiment 2

At step S1, a high resistivity silicon wafer was placed into a high temperature furnace to perform high temperature oxidation thermal cleaning at a temperature of 600° C. for 3 h at a flow rate of oxygen 10 sccm.

At step S2, the clean Si wafer was conveyed into the PbS evaporation reaction chamber and heated to 50° C. after a vacuum degree reached $5\times10^{-4}$ Pa, and then a PbS source temperature was gradually increased to an eruption temperature. Next, chlorine gas was introduced at a flow rate of 10 sccm and the vacuum degree of the reaction chamber was maintained at $2\times10^{-2}$ Pa by adjusting a pumping force of a vacuum system. After vacuum stabilization, a growth baffle plate was opened to start to carry out PbS deposition. After two hours, the baffle plate was closed, a PbS source and a substrate heating power source were stopped, and the chlorine gas input was also stopped. The thin film had a thickness of 1.2 microns. The PbS deposition rate was 0.6 microns/hour.

At step S3, the PbS thin film on the Si wafer substrate was placed into a sensitization furnace, and oxygen was introduced at a flow rate of 10 sccm to enable a pressure inside the furnace to stay at 1.01 atmospheric pressures. Next, the sensitization furnace was heated to 400° C., and then iodine vapor of 0.1 sccm was introduced for 30 min Afterwards, the temperature started to drop. After the temperature was decreased to 250° C., the supply of iodine vapor was stopped. After the temperature was decreased to room temperature, the supply of oxygen was stopped. At this time, in a case of 600k blackbody, the room temperature peak detection rate of the PbS detector was $2.2\times10^{11}$ Jones.

Embodiment 3

At step S1, a common glass wafer of 3 inches was placed in acetone, ethanol and de-ionized water in sequence for respective ultrasonic cleaning for 10 min, and then placed in a concentrated sulfuric acid for 2 h of impregnation, and then the substrate was washed repeatedly using flowing de-ionized water, and then ultrasonically cleaned for 10 min in de-ionized water and then dried to obtain a glass wafer substrate with clean surface.

At step S2, the clean glass substrate was conveyed into the PbS evaporation reaction chamber and heated to 50° C. after a vacuum degree reached $2\times10^{-4}$ Pa, and then a PbS source temperature was gradually increased to an eruption temperature. Next, chlorine gas was introduced at a flow rate of 25 sccm and the vacuum degree of the reaction chamber was maintained at $5\times10^{-2}$ Pa by adjusting a pumping force of a vacuum system. After vacuum stabilization, a growth baffle plate was opened to start to carry out PbS deposition. After three hours, the baffle plate was closed, a PbS source and a substrate heating power source were stopped, and the oxidant input was also stopped. The thin film had a thickness of 1.2 microns. The PbS deposition rate was 0.4 microns/hour.

At step S3, the glass substrate PbS thin film was placed into a sensitization furnace, and oxygen was introduced at a flow rate of 10 sccm to enable a pressure inside the furnace to stay at 1.005 atmospheric pressures. Next, the sensitization furnace was heated to 400° C., and then iodine vapor of 0.1 sccm was introduced for 30 min. Afterwards, the temperature started to drop. After the temperature was decreased to 250° C., the supply of iodine vapor was stopped. After the temperature was decreased to room temperature, the supply of oxygen was stopped. At this time, in a case of 600k blackbody, the room temperature peak detection rate of the PbS detector was $0.8\times10^{11}$ Jones as shown by the point B in FIG. 2.

Embodiment 4

At step S1, a common glass of 3 inches was placed in acetone, ethanol and de-ionized water in sequence for respective ultrasonic cleaning for 10 min, and then placed in a concentrated sulfuric acid for 2 h of impregnation, and then the glass substrate was washed repeatedly using flowing de-ionized water, and then ultrasonically cleaned for 10 min in de-ionized water and then dried to obtain a substrate with clean surface.

At step S2, the clean glass substrate was conveyed into the PbS evaporation reaction chamber and heated to 50° C. after a vacuum degree reached $2\times10^{-4}$ Pa, and then a PbS source temperature was gradually increased to an eruption temperature. Next, chlorine gas was introduced at a flow rate of 10 sccm and the vacuum degree of the reaction chamber was maintained at $2\times10^{-2}$ Pa by adjusting a pumping force of a vacuum system. After vacuum stabilization, a growth baffle plate was opened to start to carry out PbS deposition. After two hours, the baffle plate was closed, a PbS source and a substrate heating power source were stopped, and the oxidant input was also stopped. The thin film had a thickness of 1.2 microns. The PbS deposition rate was 0.6 microns/hour.

At step S3, the glass substrate PbS thin film was placed into a sensitization furnace, and oxygen was introduced at a flow rate of 10 sccm to enable a pressure inside the furnace to stay at 1.001 atmospheric pressures. Next, the sensitization furnace was heated to 200° C., and then iodine vapor of 0.1 sccm was introduced for 30 min. Afterwards, the temperature started to drop and the supply of iodine vapor was stopped. After the temperature was decreased to room temperature, the supply of oxygen was stopped. At this time, in a case of 600k blackbody, the room temperature peak detection rate of the PbS detector was $0.78\times10^{11}$ Jones as shown by the point C in FIG. 3.

Embodiment 5

At step S1, a common glass wafer of 3 inches was placed in acetone, ethanol and de-ionized water in sequence for respective ultrasonic cleaning for 10 min, and then placed in a concentrated sulfuric acid for 2 h of impregnation, and then the glass substrate was washed repeatedly using flowing de-ionized water, and then ultrasonically cleaned for 10 min in de-ionized water and then dried to obtain a glass wafer substrate with clean surface.

At step S2, the clean glass substrate was conveyed into the PbS evaporation reaction chamber and heated to 50° C. after a vacuum degree reached $2\times10^{-4}$ Pa, and then a PbS source temperature was gradually increased to an eruption temperature. Next, chlorine gas was introduced at a flow rate of 10 sccm and the vacuum degree of the reaction chamber was maintained at $2\times10^{-2}$ Pa by adjusting a pumping force of a vacuum system. After vacuum stabilization, a growth baffle plate was opened to start to carry out PbS deposition. After two hours, the baffle plate was closed, a PbS source and a substrate heating power source were stopped, and the oxidant input was also stopped. The thin film had a thickness of 1.2 microns. The PbS deposition rate was 0.6 microns/hour.

At step S3, the glass substrate PbS thin film was placed into a sensitization furnace, and oxygen was introduced at a flow rate of 10 sccm to enable a pressure inside the furnace to stay at 1.001 atmospheric pressures. Next, the sensitization furnace was heated to 400° C., and then iodine vapor of 0.1 sccm was introduced for 75 min. Afterwards, the temperature started to drop. After the temperature was decreased to 250° C., the supply of iodine vapor was stopped. After the temperature was decreased to room temperature, the supply of oxygen was stopped. At this time, in a case of 600k blackbody, the room temperature peak detection rate of the PbS detector was $0.92\times10^{11}$ Jones as shown by the point D in FIG. 3.

Embodiment 6

At step S1, a common glass of 3 inches was placed in acetone, ethanol and de-ionized water in sequence for respective ultrasonic cleaning for 10 min, and then placed in a concentrated sulfuric acid for 2 h of impregnation, and then the substrate was washed repeatedly using flowing de-ionized water, and then ultrasonically cleaned for 10 min in de-ionized water and then dried to obtain a substrate with clean surface.

At step S2, the clean glass substrate was conveyed into the PbS evaporation reaction chamber and heated to 50° C. after a vacuum degree reached $2 \times 10^{-4}$ Pa, and then a PbS source temperature was gradually increased to an eruption temperature. Next, chlorine gas was introduced at a flow rate of 10 sccm and the vacuum degree of the reaction chamber was maintained at $2 \times 10^{-2}$ Pa by adjusting a pumping force of a vacuum system. After vacuum stabilization, a growth baffle plate was opened to start to carry out PbS deposition. After two hours, the baffle plate was closed, a PbS source and a substrate heating power source were stopped, and the oxidant input was also stopped. The thin film had a thickness of 1.2 microns. The PbS deposition rate was 0.6 microns/hour.

At step S3, the glass substrate PbS thin film was placed into a sensitization furnace, and oxygen was introduced at a flow rate of 1 sccm to enable a pressure inside the furnace to stay at 1.0001 atmospheric pressures. Next, the sensitization furnace was heated to 400° C., and then iodine vapor of 1 sccm was introduced for 2 min. Afterwards, the temperature started to drop. After the temperature was decreased to 250° C., the supply of iodine vapor was stopped. After the temperature was decreased to room temperature, the supply of oxygen was stopped. At this time, in a case of 600k blackbody, the room temperature peak detection rate of the PbS detector was $0.76 \times 10^{11}$ Jones as shown by the point E in FIG. 5.

Embodiment 7

At step S1, a common glass of 3 inches was placed in acetone, ethanol and de-ionized water in sequence for respective ultrasonic cleaning for 10 min, and then placed in a concentrated sulfuric acid for 2 h of impregnation, and then the substrate was washed repeatedly using flowing de-ionized water, and then ultrasonically cleaned for 10 min in de-ionized water and then dried to obtain a substrate with clean surface.

At step S2, the clean glass substrate was conveyed into the PbS evaporation reaction chamber and heated to 50° C. after a vacuum degree reached $2 \times 10^{-4}$ Pa, and then a PbS source temperature was gradually increased to an eruption temperature. Next, chlorine gas was introduced at a flow rate of 10 sccm and the vacuum degree of the reaction chamber was maintained at $2 \times 10^{-2}$ Pa by adjusting a pumping force of a vacuum system. After vacuum stabilization, a growth baffle plate was opened to start to carry out PbS deposition. After two hours, the baffle plate was closed, a PbS source and a substrate heating power source were stopped, and the oxidant input was also stopped. The thin film had a thickness of 1.2 microns. The PbS deposition rate was 0.6 microns/hour.

At step S3, the glass substrate PbS thin film was placed into a sensitization furnace, and oxygen was introduced at a flow rate of 1 sccm to enable a pressure inside the furnace to stay at 1.001 atmospheric pressures. Next, the sensitization furnace was heated to 400° C., and then iodine vapor of 0.1 sccm was introduced for 10 min. Afterwards, the temperature started to drop. After the temperature was decreased to 250° C., the supply of iodine vapor was stopped. After the temperature was decreased to room temperature, the supply of oxygen was stopped. At this time, in a case of 600k blackbody, the room temperature peak detection rate of the PbS detector was $1.5 \times 10^{11}$ Jones as shown by the point F in FIG. 5.

Embodiment 8

At step S1, a common glass of 3 inches was placed in acetone, ethanol and de-ionized water in sequence for respective ultrasonic cleaning for 10 min, and then placed in a concentrated sulfuric acid for 2 h of impregnation, and then the substrate was washed repeatedly using flowing de-ionized water, and then ultrasonically cleaned for 10 min in de-ionized water and then dried to obtain a substrate with clean surface.

At step S2, the clean glass substrate was conveyed into the PbS evaporation reaction chamber and heated to 50° C. after a vacuum degree reached $2 \times 10^{-4}$ Pa, and then a PbS source temperature was gradually increased to an eruption temperature. Next, chlorine gas was introduced at a flow rate of 10 sccm and the vacuum degree of the reaction chamber was maintained at $2 \times 10^{-2}$ Pa by adjusting a pumping force of a vacuum system. After vacuum stabilization, a growth baffle plate was opened to start to carry out PbS deposition. After two hours, the baffle plate was closed, a PbS source and a substrate heating power source were stopped, and the oxidant input was also stopped. The thin film had a thickness of 1.2 microns. The PbS deposition rate was 0.6 microns/hour.

At step S3, the glass substrate PbS thin film was placed into a sensitization furnace, and oxygen was introduced at a flow rate of 10 sccm to enable a pressure inside the furnace to stay at 1.01 atmospheric pressures. Next, the sensitization furnace was heated to 400° C., and then iodine vapor of 0.01 sccm was introduced for 240 min Afterwards, the temperature started to drop. After the temperature was decreased to 250° C., the supply of iodine vapor was stopped. After the temperature was decreased to room temperature, the supply of oxygen was stopped. At this time, in a case of 600k blackbody, the room temperature peak detection rate of the PbS detector was $2.0 \times 10^{11}$ Jones as shown by the point G in FIG. 5.

Embodiment 9

At step S1, a common glass wafer of 3 inches was placed in acetone, ethanol and de-ionized water in sequence for respective ultrasonic cleaning for 10 min, and then placed in a concentrated sulfuric acid for 2 h of impregnation, and then the glass substrate was washed repeatedly using flowing de-ionized water, and then ultrasonically cleaned for 10 min in de-ionized water and then dried to obtain a glass wafer substrate with clean surface.

At step S2, the clean glass substrate was conveyed into the PbS evaporation reaction chamber and heated to 120° C. after a vacuum degree reached $2 \times 10^{-4}$ Pa, and then a PbS source temperature was gradually increased to an eruption temperature. Next, chlorine gas was introduced at a flow rate of 20 sccm and the vacuum degree of the reaction chamber was maintained at $4 \times 10^{-2}$ Pa by adjusting a pumping force of a vacuum system. After vacuum stabilization, a growth baffle plate was opened to start to carry out PbS deposition. After three hours, the baffle plate was closed, a PbS source and a substrate heating power source were stopped, and the oxidant input was also stopped. The thin film had a thickness of 1.3 microns. The PbS deposition rate was 0.45 microns/hour.

At step S3, the glass substrate PbS thin film was placed into a sensitization furnace, and oxygen was introduced at a flow rate of 10 sccm to enable a pressure inside the furnace to stay at 1.01 atmospheric pressures. Next, the sensitization furnace was heated to 400° C., and then iodine vapor of 0.1 sccm was introduced for 30 min. Afterwards, the temperature started to drop. After the temperature was decreased to 250° C., the supply of iodine vapor was stopped. After the temperature was decreased to room temperature, the supply of oxygen was stopped. At this time, in a case of 600k blackbody, the room temperature peak detection rate of the PbS detector was $1.6 \times 10^{11}$ Jones.

Embodiment 10

At step S1, a sapphire ($Al_2O_3$) wafer was placed into a high temperature furnace to perform high temperature oxidation thermal cleaning at the temperature of 600° C. for 3 h at the flow rate of oxygen 10 sccm.

At step S2, the clean sapphire wafer was conveyed into the PbS evaporation reaction chamber and heated to 120° C. after a vacuum degree reached $8 \times 10^{-4}$ Pa, and then a PbS source temperature was gradually increased to an eruption temperature. Next, ozone was introduced at a flow rate of 18 sccm and the vacuum degree of the reaction chamber was maintained at $5 \times 10^{-2}$ Pa by adjusting a pumping force of a vacuum system. After vacuum stabilization, a growth baffle plate was opened to start to carry out PbS deposition. After deposition, the baffle plate was closed, a PbS source and a substrate heating power source were stopped, and the ozone input was also stopped. The thin film had a thickness of 1.2 microns. The PbS deposition rate was controlled to 0.8 microns/hour.

At step S3, the PbS thin film on the sapphire wafer substrate was placed into a sensitization furnace, and air was introduced at a flow rate of 2 sccm to enable a pressure inside the furnace to stay at 1.001 atmospheric pressures. Next, the sensitization furnace was heated to 360° C., and then iodine vapor of 1 sccm was introduced for 3 min Afterwards, the temperature started to drop. After the temperature was decreased to 250° C., the supply of iodine vapor was stopped. After the temperature was decreased to room temperature, the supply of air was stopped. At this time, in a case of 600k blackbody, the room temperature peak detection rate of the PbS detector was $1.1 \times 10^{11}$ Jones.

Embodiment 11

At step S1, a zinc sulfide (ZnS) wafer was placed in acetone, ethanol and de-ionized water in sequence for respective ultrasonic cleaning for 10 min and then dried to obtain a substrate with clean surface.

At step S2, the clean ZnS wafer was conveyed into the Pb S evaporation reaction chamber and heated to 80° C. after a vacuum degree reached $5 \times 10^{-4}$ Pa, and then a PbS source temperature was gradually increased to an eruption temperature. Next, a hydrogen peroxide liquid was passed through at a flow rate of 25 sccm with oxygen as a carrier gas, and the vacuum degree of the reaction chamber was maintained at $3 \times 10^{-2}$ Pa by adjusting a pumping force of a vacuum system. After vacuum stabilization, a growth baffle plate was opened to start to carry out PbS deposition. After deposition, the baffle plate was closed, a PbS source and a substrate heating power source were stopped, and the carrier gas and hydrogen peroxide input was also stopped. The thin film had a thickness of 1.5 microns. The PbS deposition rate was controlled to 1.2 microns/hour.

At step S3, the PbS thin film on the ZnS wafer substrate was placed into a sensitization furnace, and argon gas was introduced at a flow rate of 5 sccm to enable a pressure inside the furnace to stay at 1.005 atmospheric pressures. Next, the sensitization furnace was heated to 250° C., and then iodine vapor of 0.01 sccm was introduced for 240 min. Afterwards, the temperature started to drop and the supply of iodine vapor was stopped. After the temperature was decreased to room temperature, the supply of argon gas was stopped. At this time, in a case of 600k blackbody, the room temperature peak detection rate of the PbS detector was $0.96 \times 10^{11}$ Jones.

The above descriptions are made only to the embodiments of the present invention and shall not be intended to limit the scope of protection of the present invention. It should be pointed out that several variations and improvements made by those skilled in the art without departing from the idea of the present invention shall all fall within the scope of protection of the present invention.

What is claimed is:

1. A method for preparing a wafer-level lead sulfide (PbS) near infrared photosensitive thin film, comprising the following steps:
    at step S1, selecting an appropriate substrate material, and cleaning a surface of the selected substrate material to obtain a substrate with clean surface; wherein the substrate has insulation property and temperature resistance;
    at step S2, introducing a vaporized oxidant into a vacuum evaporation chamber under a high background vacuum degree, and slowly depositing a PbS thin film from a PbS evaporation source on the clean substrate surface in step S1 to obtain a microstructure with medium particle, loose structure and consistent orientation; wherein a vacuum degree of the vacuum chamber is maintained at $2\text{-}5 \times 10^{-2}$ Pa after introduction of the oxidant, and a flow rate of introducing the oxidant is controlled to 10-25 sccm; a deposition temperature of the PbS thin film is controlled at 50-120 degrees Celsius, a PbS deposition rate is controlled to 0.5-1.2 microns/hour, and a PbS thickness is controlled to 1.2-1.5 microns;
    at step S3, at a temperature of 200-400° C., obtaining a PbS photosensitive thin film by performing sensitization for the PbS thin film prepared at step S2 for 5-240 min by using iodine vapor carried by a carrier gas;
    wherein the oxidant introduced into the vacuum chamber at step S2 comprises halogen gas, ozone, and hydrogen peroxide.

2. The method according to claim 1, wherein the substrate in step S1 is resistant to treatment at a temperature 450° C. and comprises one of silicon (Si), Sapphire (Al2O3), fused quartz glass (SiO2), glass, zinc sulfide (ZnS), zinc selenide (ZnSe), and calcium fluoride (CaF2).

3. The method according to claim 2, wherein the cleaning in step S1 is performed by wet chemical cleaning or thermal cleaning; and the cleaning comprises:
    1) Placing in acetone, ethanol and de-ionized water in sequence for ultrasonic cleaning;
    2) Employing one or more of acid wash, alkali wash and plasma cleaning; and
    3) cleaning the substrate by using de-ionized water and drying to obtain the substrate with clean surface.

4. The method according to claim 3, wherein the substrate surface treatment in step S1 is performed by wet chemical cleaning.

5. The method according to claim 4, wherein the deposition of the PbS thin film in the vacuum chamber in step S2 is performed by resistive thermal evaporation, electron beam thermal evaporation or magnetron sputtering, and a purity of a PbS evaporation source is not smaller than 99.99%.

6. The method according to claim 5, wherein the carrier gas in step S3 is air, high purity oxygen or inert gas, and the carrier gas is introduced at a flow rate of 1-10 sccm; a flow rate of iodine vapor is controlled at 0.01-1 sccm; and a pressure of sensitization treatment is controlled at 1.001-1.005 standard atmospheric pressures.

* * * * *